United States Patent [19]

Mueller et al.

[11] Patent Number: 4,792,959
[45] Date of Patent: Dec. 20, 1988

[54] LASER DIODE

[75] Inventors: Gustav Mueller; Engelbert Hartl; Martin Honsberg, all of Munich, Fed. Rep. of Germany

[73] Assignee: Siemens Aktiengesellschaft, Berlin and Munich, Fed. Rep. of Germany

[21] Appl. No.: 8,752

[22] Filed: Jan. 30, 1987

[30] Foreign Application Priority Data

Feb. 10, 1986 [DE] Fed. Rep. of Germany ....... 3604192

[51] Int. Cl.$^4$ .............................................. H01S 3/19
[52] U.S. Cl. ..................................... 372/46; 357/17
[58] Field of Search ...................... 372/46, 50; 357/17

[56] References Cited

U.S. PATENT DOCUMENTS 4,352,187 9/1982 Amann ................................. 372/46
4,692,927 9/1987 Sawai et al. ......................... 372/46

FOREIGN PATENT DOCUMENTS 2856507 7/1980 Fed. Rep. of Germany .
3401102 7/1985 Fed. Rep. of Germany .
0057689 4/1985 Japan .................................. 372/46

OTHER PUBLICATIONS

P. C. Chen et al., "A New GaInAsP/InP T-Laser at 1.2 μm Fabricated on Semi-Insulating Substrate", *Japanese Journal of Applied Physics,* vol. 19, No. 12, (1980), pp. L775-L776.

S. Tarucha et al., "Monolithic Integration of a Laser Diode and an Optical Waveguide Modulator Having a GaAs/AlGaAs Quantum Well Double Heterostructure", *Appl. Phys. Lett.,* 48(1), Jan. 6, 1986, pp. 1-3.

Z. L. Lian, et al., "Low Threshold GaInAsP/InP Buried-Heterostructure Lasers with a Chemically Etched and Mass-Transported Minor", vol. 44, No. 10, Appl. Phys. Lett., pp. 945-947, (May 15, 1984).

M. C. Amann, "New Contacting System for Low-Expense GaAs-AlGaAs Light Sources," vol. 34, No. 12, Frequenz, pp. 343-346, (1980).

T. H. Windhorn, et al., "Room-Temperature Operation of GaAs/AlGaAs Diode Lasers Fabricated on a Monolithic GaAs/Si Substrate", vol. 47, No. 10, Apply. Phys. Lett., pp. 1031-1033, (Nov. 15, 1985).

*Primary Examiner*—James W. Davie
*Attorney, Agent, or Firm*—Hill, Van Santen, Steadman & Simpson

[57] ABSTRACT

A laser diode is provided having a strip-shaped web based on the principle of a metal clad ridge waveguide laser diode with a strip-shaped web width of less than 10 μm. At least one lateral web extends laterally of the strip-shaped web and serves as a carrier for an electrical connection between the metal cladding of the strip-shaped web and a contacting surface for an electrical lead.

17 Claims, 1 Drawing Sheet

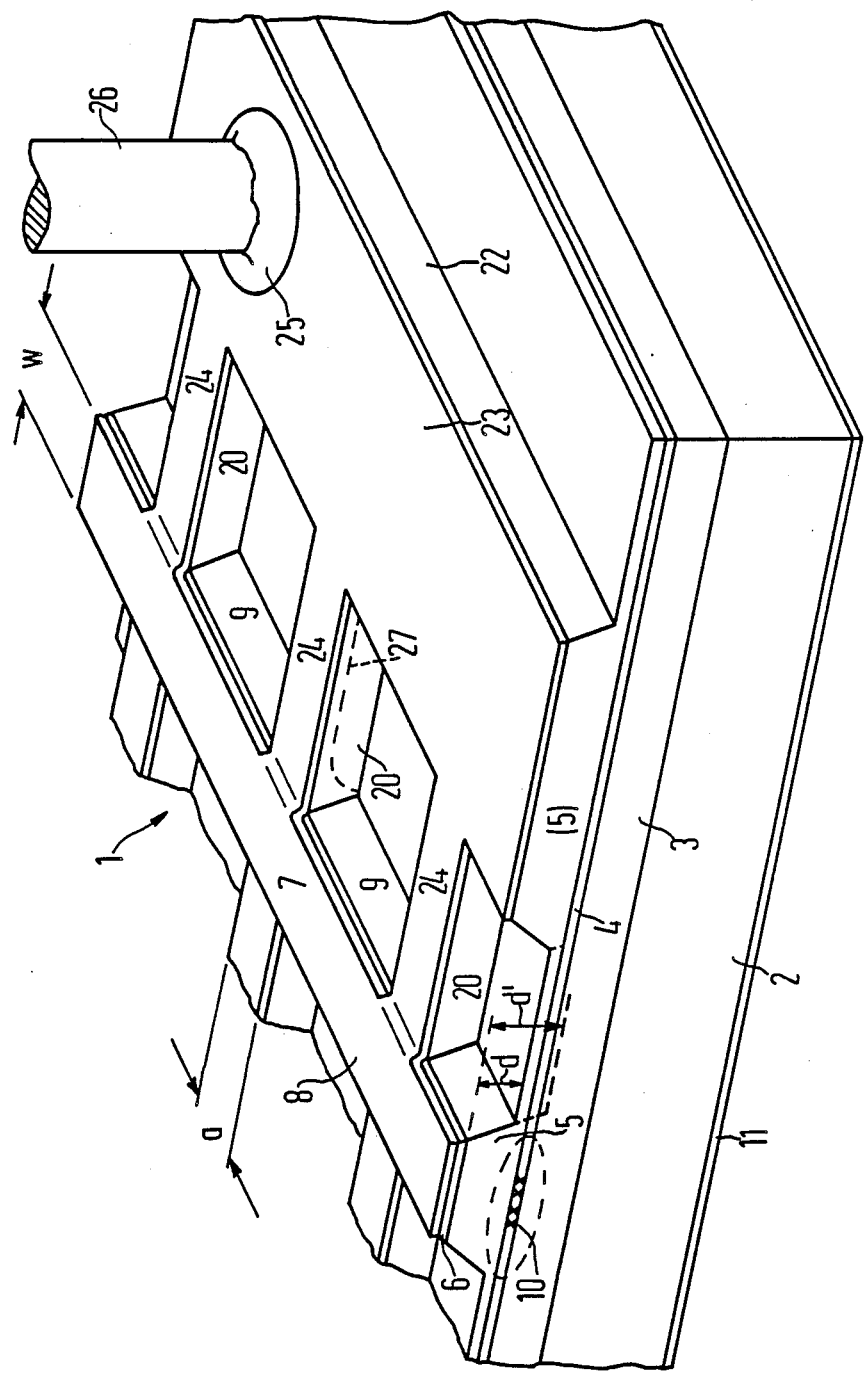

LASER DIODE

BACKGROUND OF THE INVENTION

1. Field of the Invention

The present invention relates generally to a laser diode having a double heterostructure in a strip-shaped ridge.

2. Description of the Related Art

In U.S. Pat. No. 4,352,187 and in the publication "Frequenz...", vol. 34 (1980), pages 343 through 346, is disclosed a metal clad ridge waveguide (MCRW) laser diode having a semiconductor layer double hetero-layer structure and a strip-shaped ridge with a contact coating. For improved waveguide performance, the laser diode is provided with a third layer of the double hetero-layer structure which has reduced thickness laterally of the ridge, the strip-shaped web having a width of between 2 to 10 μm.

The contact coating of the laser diode extends from the upper side of the ridge down over the sidewalls of the ridge to the surface of the reduced thickness third layer of the double heter-layer structure. To obtain an optimum waveguide performance for the laser emission which is generated in the laser-active second layer of the hetero-layer structure, it is necessary to provide a residual thickness of the third layer of the double hetero-layer structure.

In FIG. 1 of the publication "Frequenz...", a mesa format is identified having a layer structure with a width of 150 μm. Such layer structure format is not to be confused with a ridge in the sense of a metal clad ridge waveguide laser diode. No wave guidance based on the principle of MCRW laser diodes whatsoever comes into consideration given such a width of the disclosed format.

SUMMARY OF THE INVENTION

An object of the present invention is to provide a laser diode having a double hetero-layer structure and a strip-shaped ridge, or ridge, with a contact coating and which has improved waveguide performance.

This and otehr objects are achieved in a laser diode having at least one lateral ridge extending laterally of a strip-shaped ridge and forming a contact surface for an electrical contact connection. In some embodiments, lateral ridges may be disposed at both sides of the strip-shaped ridge.

It is assumed for purposes of the present specification that a double hetero-layer structure includes at least four layers located one on top of another on a substrate. Without representing a significant departure from the principle of double hetero-layer structures, the first layer and the substrate can be of the same material, for exmaple, Further, the fourth layer is not absolutely necessary in every instance. Insofar as it is possible to apply a suitable contact coating to the third layer, the fourth layer is superfluous. This depends on the material of which the third layer is formed. Thus, the four layer structure forms the basis for the following discussion, whereby the omission of the first and/or the fourth layer is included by analogy. The laser-active layer is designated herein as the second layer for the sake of convenience, although in some embodiments it may be other than second in the layer sequence.

The present invention is based on a number of ideas whose adaptation to one another has led to the present invention. First, it is assumed that a reduction in the thickness of the third layer at the surface portions which are laterally adjacent to the strip-shaped ridge is fundamentally advantageous. According to the teaching of the above-described related art, however, a further reduction in the thickness of the third layer is discouraged due to the justified fears that too slight of a remaining third layer thickness can lead to electrical shorts between the contact coating on the sidewalls of the ridge and the second, laser-active layer. However, to ahve a faultless contact with the electrode strip necessary along the upper side of the narrow web, and appropriately large area contact coating is useful. Consideration must be given to the fact that the electrode strip disposed at the upper side of the ridge is fed with a relatively high electrical current for operation in the laser mode, so that considerable demands are made of the contact structure.

A solution provided by teh instant invention is that, first, the contact coating is essentially restricted to the upper side of the strip-shaped ridge and, second, that the third layer, i.e. the layer adjacent the second, laser-active layer in the layer structure sequence and which is situated between the second layer and the (third or the) fourth layer carrying the contact coating, is nearly completely removed laterally of the strip-shaped ridge. In other words, the third layer has only an extremely slight remaining thickness, or is entirely eliminated, at least in the region neighboring the strip-shaped ridge. It is within the framework of the present invention to remove at least a portion of the second layer, as well.

In the resulting structure, a problem arises of contacting the contact coating that is now restricted only to the upper side of the strip-shaped ridge and has a width of only a few micrometers. The problem is solved by the following measures: at least one, and preferably a plurality of, lateral ridges are provided at a right angles to the strip-shaped ridge. The lateral ridges extend laterally away from the strip-shaped ridge of the laser diode and serve as carriers for electrical contact connections similar to that of circuit interconnects. Practically only the upper side of the lateral ridges is covered with an electrical contact connection.

Preferably, the height of the lateral ridges is approximately the same as that of the strip-shaped ridge of the laser diode. The electrical contact connections and the strip-shaped contact coating of the laser diode, thus, do not lie at significantly different levels, so that no substantial steps are present which could lead to contact interruptions.

An expedient embodiment for the lateral ridges is to allow the material of the third layer of the double heterolayer structure to remain at the regions of the lateral ridges. The electrical contact connection on the upper side of this third layer is then electrically insulated form the second, laser-active layer of the layer structure. The lateral ridges, however, can also be formed by subsequently applied insulating oxide materials.

Provided within the framework of the invention as an additional feature is a contact surface for contacting of the laser diode which is insulated form the second, laser-active layer. Expediently, the contact surface is disposed on a mesa structure. The mesa is preferably composed of a non-eliminated portion of the third layer. In such case, the lateral ridges and the mesa of the contact surface, as well as a portion of the strip-shaped ridge of the actual laser diode are composed of non-eliminated portions of the third layer. As a rule, the strip-shaped ridge of the laser diode includes the fourth layer under the strip-shaped contact coating. For the sake of completeness, it should be pointed out that the material of the fourth layer actually only serves the purpose of achieving a low impedance contact between the contact coating of the strip-shaped ridge and the material of the third layer disposed beneath the fourth layer. By contrast, a blocking junction is usually present in the region of the lateral ridges and of the contacting surface, as is known from MCRW laser diodes.

BRIEF DESCRIPTION OF THE DRAWINGS

The FIGURE is a perspective view of a portion of a laser diode according to the principles of the present invention.

DESCRIPTION OF THE PREFERRED EMBODIMENTS

A laser diode of the present invention is shown in the FIGURE and is referenced geenrally at 1. Four layers of a double hetero-layer structure are disposed on a substrate body 2 of, for example, n-indium-phosphide. A first layer of the double heterostructure is referenced 3 and is composed, for example, of indium phosphide. An ajdacnet layer referenced 4 is the second, laser-active layer of the layer structure. The second layer 4 is preferably i-conductive and is formed, for example, of indium-gallium arsenide-phosphide. A third layer of the double heterostructure is referenced 5 amd is composed of a p-conductive material, for instance, of indium-phosphide. An uppemost, fourth layer 6 of the layer structure is composed of relatively highly doped, preferably p-conductive material, such as, for example, indium phosphide.

A strip contact 7 is preferably of gold. As can be seen in the FIGURE, an elongated ridge typical of a metal clad ridge waveguide (MCRW) laser diode is present and is indicated at 8. The strip-shaped ridge 8 has a width of less than 10 μm in the preferred embodiments. The strip-shaped ridge 8 in the present invention also functions in the way knwon to MCRW laser diodes. The ridge 8 has sidewalls 9 which are, however, preferably free of metal coating that is typically found on an MCRW laser diode.

As shown, the material of the third layer 5 of the double hetero-layer structure is removed at both sides of the ridge 8, such as by being etched by a photolithographic method. Corresponding portions of the fourth layer 6 are likewise removed.

In the present invention, a depth indicated at d to which material of the third layer 5 is removed is preferably greater than that for the known MCRW laser diodes. In particular, the depth d is nearly equal or is equal to the full layer thikcness of the third layer 5. In one embodiment, the remaining third layer 5 laterally of the ridge 8 has a thickness of less than 0.4 μm. The depression formed thereby laterally of the ridge 8, thus, extends down to the laser-active layer 4. Alternatively, the semiconductor material of the layer structure is removed into the second layer 4 or even through the second layer 4 as indicated by the depth d' shown in broken lines. Forming the ridge 8, thusly, is a significant contributing factor to good waveguide operation for the generated laser emission, whose exit location is indicated at 10.

Lateral ridges 20 are provided in the instant invention. Although a single later rige 20 can be provided, an arrangement of a plurality of lateral ridges 20 is more advantageous, where the lateral ridges 20 are preferably arranged at periodic intervals along the ridge 8. Such periodicity of the lateral ridges 20 has a beneficial effect on monomode selection.

A contacting surface 23 includes a mesa 22. The mesa 22 is formed as part of the layer 5 in the illustrated embodiment. The contacting surface 23 is a metallization, or metal layer, at an upper surface of the mesa 22. Metallic contact connections 24 provide an electrical contact between the strip-shaped coating 7 of the laser ridge 8 and the contacting surface 23. As shown, the material of the fourth layer 65 is removed from the lateral ridges 20 and the mesa 22, whereby the material of the layer 6 guarantees a low impedance, non-blocking junction under the strip-shaped contact coating 7. THus, an essentially blocking junction is present between the semiconductor material of the lateral ridges 20 an the mesa 22, on one hand, and this coating 23 and 24 disposed on the surfaces thereof, on the other hand. This condition analogously corresponds to the conditions necessary for an MCRW laser diode.

A contacting location for an electrical lead 26 is referenced 25. A cooperating electrode forming a second terminal of the laser diode for the strip-shaped contact coating 7 is formed by a back coating 11 on the substrate 2.

On one of the lateral ridges 20 shown in the FIGURE, a contour 27 is indicated in broken lines to show the possibility that the lateral ridges 20 can be formed as a type of bridge.

Instaed of being composed of a material of the third layer 5, the lateral ridges 20 and/or the mesa 22 can also be formed of some other material as indicated by the broken lines on either side of the mesa 22 in the FIGURE. In such case, the material of the third layer 5 is eliminated down to the depth d, or d', in the regions of the lateral ridges 20 and the mesa 22 and the lateral ridges 20 and the mesa 22 are thereafter formed by applying an insulating material of, for example, a semiconductor oxide.

The FIGURE shows the strip-shaped ridge 8 forming a laser diode and including structures to the right of the ridge 8. The same structure is advantageously provided at the left side of the strip-shaped ridge 8, as well. However, for the present invention, a single-sided arrangement of the lateral ridges 20 and the contacting surface 23 including the mesa 22 may instead be provided.

By providing a plurality of later ridges 20 along the ridge 8, an especially uniform current distribution in the contact coating 7 and, thus, in the region of the laser emission generating zone 10 of the layer 4 is promoted. Furthermore, a symmetrical distribution of lateral ridges 20 about the ridge 8 provides increased thermal stability.

In one embodiment, the length of the contact coating 7 of the ridge is, for example, approximately 200 μm. The width of the contact coating 7 is between 1 to 5 μm and preferably approximately 2 to 3 μm. Such a slight width has a particular advantage in a laser diode of the present invention. It is usually valid that for greater widths of the contact coating 7, a corresponding multiple of increased current through the laser diode is required without achieving a correspondingly higher intensity of usable laser emission.

In one example, for a plurality of four lateral ridges 20 distributed along a length of 200 μm of a ridge 8 and, similarly, for eight lateral ridges 20 distributed along a ridge 8 of length 400 μm, the recommended width of the lateral ridges 20 is in the range of 2 to 20 μm. A free hand is given as to the dimensions of the area of the contact surface 23 since its size has practically no influence on the conditions for generating a laser emission in the region 210.

Although other modifications and changes may be suggested by those skilled in the art, it is the intension of the inventors to embody within the patent warranted hereon all changes and modifications as reasonably and properly come within the scope of their contribution to the art.

We claim as our invention:

1. An improved laser diode formed of a semiconductor-layer double hetero-layer structure on a substrate having an electrode, the double hetero-layer structure including a strip-shaped ridge less then 10 μm wide and a contact coating wherein a third layer of the double hetero-layer structure is adjacent a second laser-active layer and between said laser-active layer and the contact coating, the third layer having a reduced thickness laterally of the ridge for wave guidance, the improvement comprising:
   said contact coating being restricted to essestially an upper side of said strip-shaped ridge;
   at least one lateral ridge extending laterally of said strip-shaped ridge;
   a contacting surface being connected to said strip-shaped ridge by said at least one lateral ridge;
   said third layer of said double hetero-layer structure being reduced to a thickness of between 0.4 μm and 0 μm laterally of said strip-shaped ridge and outside said at least on lateral ridge;
   said second laser-active layer being present in a non-reduced thickness laterally of said strip-shaped ridge and outside of said at least one lateral ridge; and
   an electrical connection between said contact coating of said strip-shaped ridge and said contacting surface formed on the upper side of said at least one lateral ridge.

2. An improved laser diode as claimed in claim 1, wherein said at least one lateral ridge forms a bridge between said strip-shaped ridge and said contacting surface.

3. An improved laser diode as claimed in claim 1, wherein a plurality of said lateral ridges are distributed along both sides of said strip-shaped ridge.

4. An improved laser diode as claimed in claim 3, wherein said plurality of said lateral ridges are symmetrically distributed along both sides of said strip-shaped ridge.

5. An improved laser diode as claimed in claim 2, wherein contacting surfaces are provided at both sides of said strip-shaped ridge.

6. An improved laser diode as claimed in claim 3, wherein contacting surfaces are provided at both sides of said strip-shaped ridge.

7. An improved laser diode as claimed in claim 1, wherein said contacting surface is disposed on a mesa structure.

8. An improved laser diode as claimed in claim 1, wherein said at least one lateral ridge is formed of said semiconductor material of said third layer.

9. An improved laser diode as claimed in claim 1, wherein said at least one lateral ridge is formed of electrically insulating material applied after at least nearly eliminating the semiconductor material of said third layer.

10. An improved laser diode as claimed in claim 1, further comprising:
    a mesa structure disposed beneath said contacting surface and formed of semiconductor material of said third layer.

11. An improved laser diode as claimed in claim 1, further comprising:
    a mesa structure disposed beneath said contacting surface and formed of electrically insulating material applied after at least nearly eliminating the material of said third layer.

12. A laser diode, comprising:
    a substrate having an electrode;
    a double hetero-structure built up on said substrate having at least a laser-active layer and a thid layer over said laser-active layer, said third layer having a thickness of at least 0.4 μm;
    an elongated ridge formed in said double hetero-structure by a reduction in the thickness of said third layer to between 0.4 μm and 0 μm laterally of said elongated ridge;
    a metallic contact extending along a top surface of said elongated ridge;
    a contact surface electrically insulated from said laser-active layer;
    an electrical lead connected at said contact surface; and
    at least one lateral ridge extending between said elongated ridge and said contact surface and including means for conducting electricity between said contact surface and said metallic contact on said elongated ridge.

13. A laser diode as claimed in claim 12, wherein said at least one lateral ridge is formed of material of said third layer.

14. A laser diode as claimed in claim 12, further comprising:
    a plurality of lateral ridges extending between said contact surface and said elongated ridge.

15. A laser diode as claimed in claim 14, wherein said plurality of ridges are at regular intervals.

16. A laser diode as claimed in claim 12, wherein said contact surface is on a mesa structure at the same height as said at least one lateral ridge.

17. A laser diode as claimed in claim 12, wherein said metallic contact has a width in the range 1 to 5 μm transversely of said elongated ridge,
    a plurality of said lateral ridges are provided each having a width in the range 2 to 20 μm.

* * * * *